United States Patent
Hongo et al.

(10) Patent No.: US 7,397,831 B2
(45) Date of Patent: Jul. 8, 2008

(54) LASER ANNEALING APPARATUS AND ANNEALING METHOD OF SEMICONDUCTOR THIN FILM USING THE SAME

(75) Inventors: Mikio Hongo, Yokohama (JP); Akio Yazaki, Fuchu (JP); Mutsuko Hatano, Kokubunji (JP)

(73) Assignee: Hitachi Displays, Ltd., Mobara-Shi (JP)

( * ) Notice: Subject to any disclaimer, the term of this patent is extended or adjusted under 35 U.S.C. 154(b) by 364 days.

(21) Appl. No.: 10/986,936

(22) Filed: Nov. 15, 2004

(65) Prior Publication Data

US 2005/0170572 A1 Aug. 4, 2005

(30) Foreign Application Priority Data

Jan. 30, 2004 (JP) ............................. 2004-022461

(51) Int. Cl.
*H01S 3/00* (2006.01)
(52) U.S. Cl. ................................. 372/38.02; 372/38.01
(58) Field of Classification Search .... 372/38.01–38.02
See application file for complete search history.

(56) References Cited

U.S. PATENT DOCUMENTS

| 4,761,561 | A | * | 8/1988 | Fujiwara et al. ............. 250/548 |
|---|---|---|---|---|
| 4,928,936 | A | * | 5/1990 | Ohkubo et al. ................ 269/73 |
| 5,622,567 | A | * | 4/1997 | Kojima et al. ................ 118/726 |
| 5,760,366 | A | * | 6/1998 | Haruta et al. .......... 219/121.68 |
| 5,863,473 | A | * | 1/1999 | Ohsawa et al. ............. 264/1.33 |
| 6,002,523 | A | * | 12/1999 | Tanaka ....................... 359/624 |
| 6,033,741 | A | * | 3/2000 | Haruta et al. ................ 427/596 |
| 6,110,291 | A | * | 8/2000 | Haruta et al. ................ 118/726 |
| 6,176,926 | B1 | * | 1/2001 | Tanaka ......................... 117/92 |
| 6,303,499 | B1 | * | 10/2001 | Sato ........................... 438/676 |
| 6,310,727 | B1 | * | 10/2001 | Tanaka ....................... 359/624 |
| 6,512,634 | B2 | * | 1/2003 | Tanaka ....................... 359/624 |
| 6,583,389 | B2 | * | 6/2003 | Murooka et al. ............ 219/216 |
| 6,677,088 | B2 | * | 1/2004 | Magome et al. ................ 430/5 |
| 6,897,963 | B1 | * | 5/2005 | Taniguchi et al. ........... 356/500 |
| 6,943,086 | B2 | * | 9/2005 | Hongo et al. ................ 438/308 |

(Continued)

FOREIGN PATENT DOCUMENTS

JP 10-209069 8/1998

(Continued)

*Primary Examiner*—Laura M Schillinger
(74) *Attorney, Agent, or Firm*—Antonelli, Terry, Stout & Kraus, LLP.

(57) ABSTRACT

A laser beam temporally modulated in amplitude by a modulator and shaped into a long and narrow shape by a beam shaper is rotated around the optical axis of an image rotator inserted between the beam shaper and a substrate. Thus, the longitudinal direction of the laser beam having the long and narrow shape is rotated around the optical axis on the substrate. In order to perform annealing in a plurality of directions on the substrate, the laser beam shaped into the long and narrow shape is rotated on the substrate while a stage mounted with the substrate is moved only in two directions, that is, X- and Y-directions.

In such a manner, the substrate can be scanned at a high speed with a continuous wave laser beam modulated temporally in amplitude and shaped into a long and narrow shape, without rotating the substrate. Thus, a semiconductor film can be annealed.

10 Claims, 10 Drawing Sheets

U.S. PATENT DOCUMENTS

| | | | |
|---|---|---|---|
| 6,967,815 B2* | 11/2005 | Usa et al. | 360/131 |
| 7,082,088 B2* | 7/2006 | Arioka et al. | 369/47.51 |
| 7,129,124 B2* | 10/2006 | Hongo et al. | 438/166 |
| 7,183,148 B2* | 2/2007 | Yazaki et al. | 438/166 |
| 2001/0032835 A1* | 10/2001 | Murooka et al. | 219/216 |
| 2001/0053030 A1* | 12/2001 | Tanaka | 359/619 |
| 2002/0187406 A1* | 12/2002 | Magome et al. | 430/5 |
| 2002/0191512 A1* | 12/2002 | Arioka et al. | 369/47.53 |
| 2003/0024905 A1* | 2/2003 | Tanaka | 219/121.6 |
| 2003/0068836 A1* | 4/2003 | Hongo et al. | 438/30 |
| 2003/0100169 A1 | 5/2003 | Tanaka et al. | |
| 2003/0147059 A1* | 8/2003 | Tokuda et al. | 355/53 |
| 2003/0147060 A1* | 8/2003 | Tokuda et al. | 355/53 |
| 2004/0041158 A1* | 3/2004 | Hongo et al. | 257/79 |
| 2004/0057158 A1* | 3/2004 | Usa et al. | 360/135 |
| 2004/0080871 A1* | 4/2004 | Usa et al. | 360/135 |
| 2005/0030508 A1* | 2/2005 | Tokuda et al. | 355/69 |
| 2005/0070035 A1* | 3/2005 | Yazaki et al. | 438/22 |
| 2005/0139582 A1* | 6/2005 | Tanaka | 219/121.75 |
| 2005/0169330 A1* | 8/2005 | Hongo et al. | 372/38.02 |
| 2005/0170572 A1* | 8/2005 | Hongo et al. | 438/166 |
| 2005/0200823 A1* | 9/2005 | Tokuda et al. | 355/69 |
| 2005/0214986 A1* | 9/2005 | Tanaka et al. | 438/149 |
| 2006/0003478 A1* | 1/2006 | Hongo et al. | 438/29 |
| 2006/0244808 A1* | 11/2006 | Miura | 347/135 |
| 2007/0041410 A1* | 2/2007 | Hongo et al. | 372/24 |
| 2007/0099401 A1* | 5/2007 | Tanaka | 438/487 |
| 2007/0131962 A1* | 6/2007 | Yazaki et al. | 257/103 |

FOREIGN PATENT DOCUMENTS

| | | |
|---|---|---|
| JP | 11-352419 | 12/1999 |
| JP | 11-352420 | 12/1999 |
| JP | 2003-124136 | 4/2003 |
| JP | 2003-179068 | 6/2003 |
| JP | 2004-151668 | 5/2004 |
| JP | 2005217213 A * | 8/2005 |

* cited by examiner

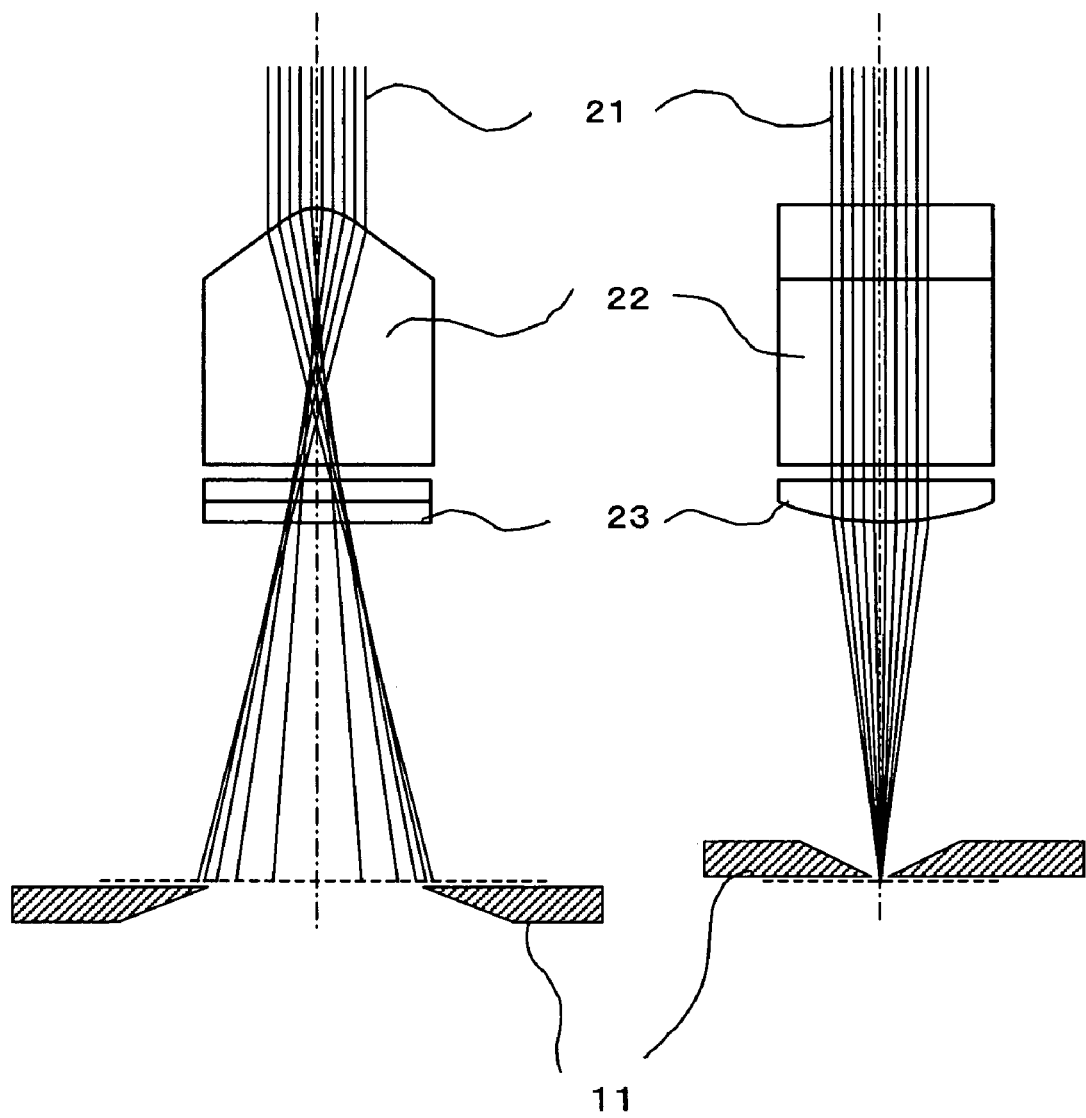

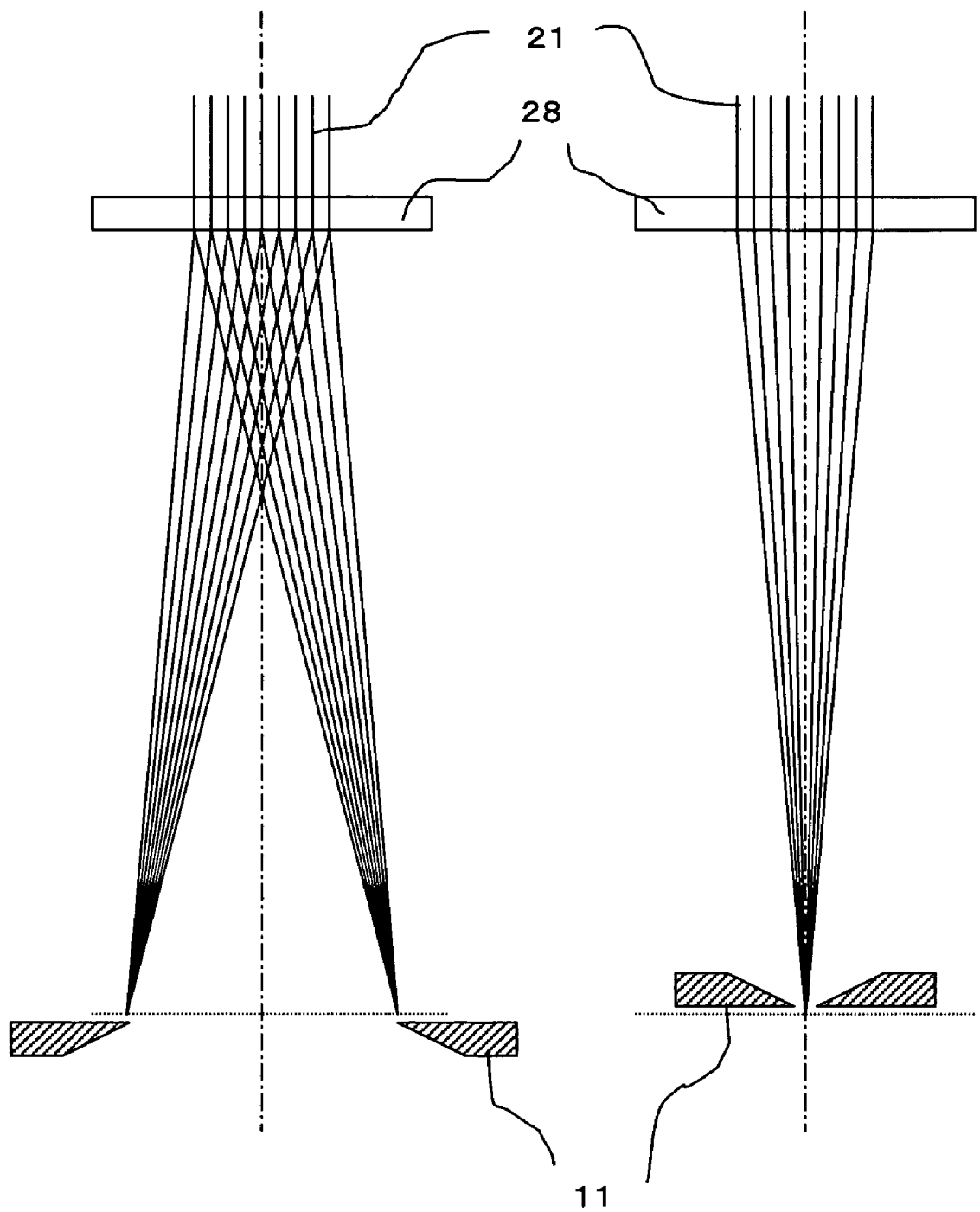

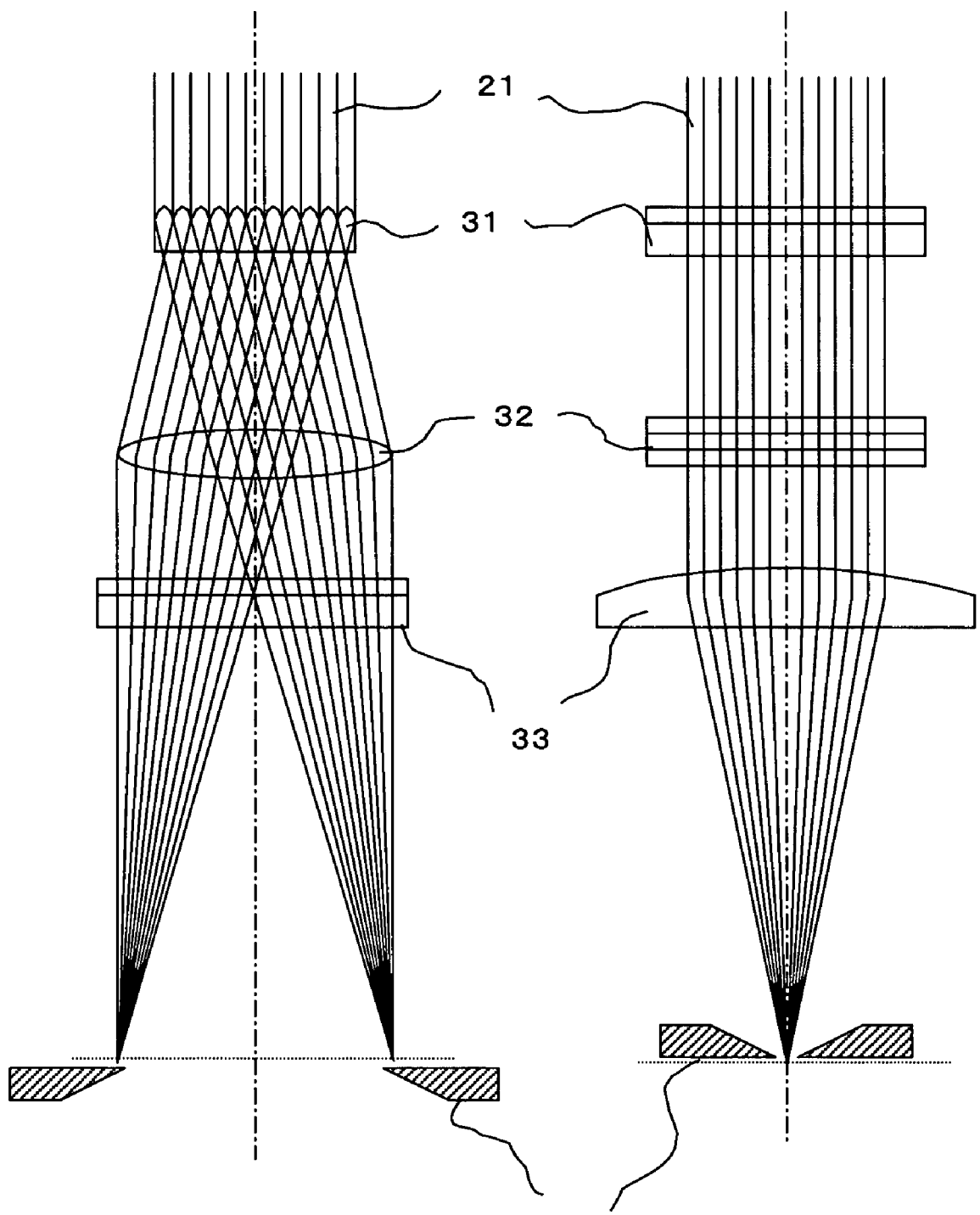

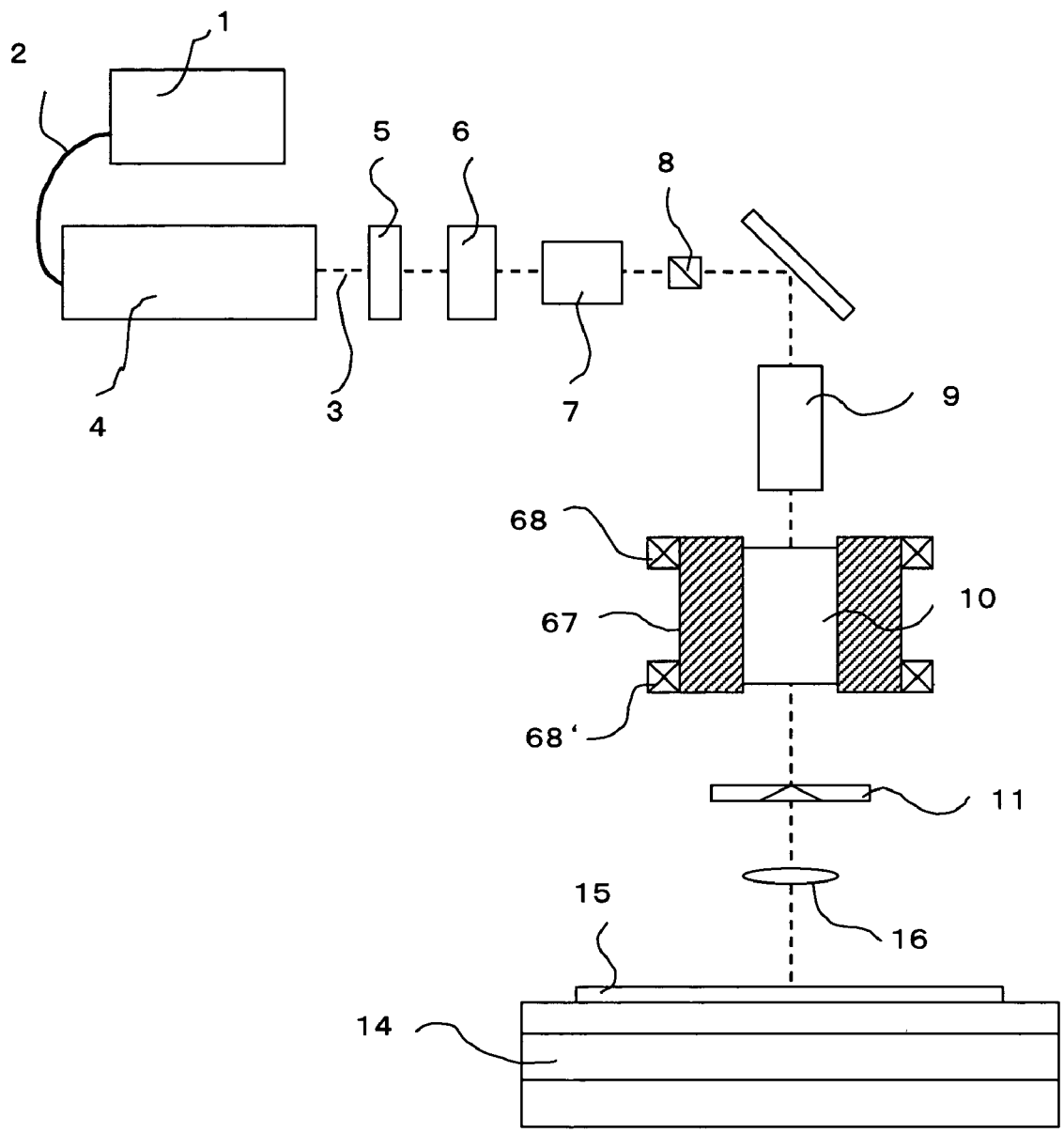

LASER ANNEALING APPARATUS AND ANNEALING METHOD OF SEMICONDUCTOR THIN FILM USING THE SAME

BACKGROUND OF THE INVENTION

The present invention relates to a laser annealing method and a laser annealing apparatus suitable for irradiating an amorphous or polycrystalline semiconductor film formed on an insulating substrate with a laser beam so as to improve the film quality or enlarge or mono-crystallize crystal grains.

At present, a flat panel type display unit using a display panel such as a liquid crystal panel or an organic EL panel is developed and put or being put into practical use. The display panel in such a display unit has a large number of pixels in its display region. The pixels are arrayed two-dimensionally (in a matrix) out of thin film transistors (TFTs) formed of an amorphous silicon film or a polycrystalline silicon film formed on a substrate of glass, fused quartz or the like. An image is formed by switching on/off the thin film transistors corresponding to the pixels. The thin film transistors of the pixels are driven and switched by a driver circuit provided outside the display region.

If the driver circuit for driving the thin film transistors of the pixels can be formed together on the substrate of the display panel, it can be expected to dramatically reduce the manufacturing cost and improve the reliability. However, due to the poor crystallinity of the silicon film forming an active layer of each thin film transistor, the performance of the thin film transistor represented by mobility is so low that it is difficult to produce a circuit required to have a high speed and a high function, such as the aforementioned driver circuit.

High-mobility thin film transistors are required to produce such a high-speed and high-function circuit. To this end, it is necessary to improve the crystallinity of the silicon thin film. Excimer laser annealing has got a lot of attention as a method for improving the crystallinity. According to this method, an amorphous silicon film formed on an insulating substrate of glass or the like is irradiated with an excimer laser so that the amorphous silicon film is transformed into a polycrystalline silicon film. Thus, the mobility is improved. However, the polycrystalline film obtained by the excimer laser irradiation has a crystal gain size of about several tens of nanometers to several hundreds of nanometers, which is insufficient in terms of performance to be applied to a driver circuit for driving a liquid crystal panel, or the like.

As a solution to this problem, Patent Document 1 discloses a method in which a temporally modulated in amplitude continuous wave laser beam is condensed linearly so as to perform irradiation while scanning at a high speed. Thus, crystal grains are grown laterally with respect to the scanning direction so as to increase the crystal grain size. According to this method, the whole surface of a substrate is made polycrystalline due to excimer laser annealing, and only a region where a driver circuit should be formed is then scanned with a laser beam in a direction following a current path (drain-source direction, also referred to as "channel") of a transistor to be formed, so as to grow crystal grains. As a result, any grain boundary crossing the current path is prevented from existing, so that the mobility is improved on a large scale.

Patent Document 2 discloses a laser annealing technique in which the longitudinal direction of a laser beam spot is made parallel to the longitudinal direction of a region to be irradiated therewith so that the irradiation efficiency of the laser beam is enhanced.

[Patent Document 1] Japanese Patent Laid-Open No. 2003-124136
[Patent Document 2] Japanese Patent Laid-Open No. 209069/1998
[Patent Document 3] Japanese Patent Laid-Open No. 352419/1999

SUMMARY OF THE INVENTION

In the aforementioned background-art techniques, specific consideration was not given to the point that a substrate might be scanned with a laser beam in a plurality of directions. That is, a normal thin film transistor panel (TFT panel) needs a drain (signal wire) driver circuit portion and a gate (scan wire) driver circuit portion as driver circuits. It is therefore necessary to perform laser annealing on the two driver circuit portions in a silicon film formed on a substrate. When the drain driver circuit portion and the gate driver circuit portion are provided in two adjacent sides of the substrate, or even when only one of the driver circuit portions is annealed, the panel has to be irradiated with a laser beam with the direction of the panel being turned at an angle of 90 degrees.

An annealing apparatus must have a function capable of annealing in at least two directions, that is, X- and Y-directions. Patent Document 2 discloses a method in which a rotary mechanism put on top of a linear motion mechanism is provided as a stage for mounting a substrate thereon, so that the substrate can be rotated to be scanned with a laser beam in different directions.

However, with increase in size of substrates, substrates 1 m or more square are to be used. To this end, the rotary stage to be mounted with a substrate also increases in size and weight, resulting in a large load in scanning with a laser beam in each of the X- and Y-directions. Particularly in high-speed scanning or in high-accuracy scanning, the heavy rotary stage must be moved together. Thus, not only is it necessary to increase the size of the XY stage, enhance the rigidity of the XY stage, and further take measures to suppress vibrations of the apparatus as a whole, but the life of the XY stage may be also shortened due to the large load. As a result, there is a problem that the manufacturing cost and the operation cost of the apparatus are increased.

Patent Document 3 discloses a method in which a beam rotating optical element and a homogenizer (beam shaper) are rotated around an optical axis concurrently so as to rotate a beam homogenized to be rectangular. Here, the homogenizer is a complicated optical system constituted by an array of a plurality of cylindrical lenses. Fine adjustment is required to attain a desired energy distribution. It is not desired that the adjusted cylindrical lens array is moved or even rotated. It is necessary to rotate the shaped beam without rotating the homogenizer constituted by the cylindrical lens array which is a complicated optical system.

To solve the foregoing problems belonging to the background art, it is an object of the present invention to provide a laser annealing method and a laser annealing apparatus in which a stage is reduced in size and weight and extended in life, and the apparatus cost is reduced, so that the method and the apparatus are suitable for manufacturing a display panel.

In order to attain the foregoing object, the laser annealing method and the laser annealing apparatus according to the present invention are characterized in that a stage mounted with a substrate for scanning the substrate at a high speed is driven only in two directions, that is, X- and Y-directions, so that a laser beam modulated temporally in amplitude and shaped into a long and narrow shape can be rotated around its optical axis on the substrate without providing any rotary stage. More specifically, the object can be attained as follows. That is, a beam passing through a homogenizer constituted by a cylindrical lens array is rotated at a desired angle by an image rotator without rotating the homogenizer. Further, as for a homogenizer having a simpler configuration, the object can be attained as follows. That is, a beam to irradiate a substrate is rotated at a desired angle by rotating the homogenizer alone without using the image rotator. Typical configurations of the present invention will be enumerated below.

(1) A laser annealing apparatus according to the present invention includes: a stage for moving a substrate mounted thereon in two directions crossing each other at right angles; a laser oscillator for oscillating a laser beam; a beam shaper for shaping the laser beam into a long and narrow shape; an imaging lens disposed in a positional relationship such that the laser beam shaped into the long and narrow shape is projected onto the substrate mounted on the stage; and a unit for rotating the laser beam shaped into the long and narrow shape around an optical axis of the laser beam.

(2) A laser annealing apparatus according to the invention includes: a stage for moving a substrate mounted thereon in two directions crossing each other at right angles; a laser oscillator for oscillating a laser beam; a beam shaper for shaping the laser beam into a long and narrow shape; a relay lens for converting the laser beam shaped into the long and narrow shape to a collimated beam; an imaging lens disposed in a positional relationship such that the collimated laser beam is projected onto the substrate mounted on the stage in a state where the laser beam has been shaped into the long and narrow shape; and a unit for rotating the laser beam shaped into the long and narrow shape around an optical axis of the laser beam.

(3) In any one of the configurations of the paragraphs (1) and (2), an image rotator inserted after the beam shaper for shaping the laser beam into a linear shape or a rectangular shape and before the imaging lens is used as the unit for rotating the laser beam shaped into the long and narrow shape around the optical axis of the laser beam.

(4) In the configuration of the paragraph (3), one of a combination of a Powell's lens and a cylindrical lens, a kaleidoscope, a diffractive optical element, and a combination of a multi-lens array and a cylindrical lens is used as the beam shaper for shaping the laser beam into a linear shape or a rectangular shape.

(5) In any one of the configurations of the paragraphs (1) and (2), a mechanism by which at least the beam shaper for shaping the laser beam into the long and narrow shape can be rotated desirably around the optical axis of the laser beam is used as the unit for rotating the laser beam shaped into the long and narrow shape around the optical axis.

(6) In the configuration of the paragraph (5), one of a combination of a Powell's lens and a cylindrical lens, a kaleidoscope, and a diffractive optical element is used as the beam shaper for shaping the laser beam into the long and narrow shape.

(7) In any one of the configurations of the paragraphs (1) to (6), the laser oscillator is an oscillator for generating a continuous wave laser beam, and a temporal amplitude modulator is placed before the beam shaper for shaping the laser beam into the long and narrow shape so that the continuous wave laser beam temporally modulated in amplitude by the temporal amplitude modulator can be shaped into the long and narrow shape.

(8) A laser annealing method according to the present invention is a method including the steps of: mounting a substrate on a stage, the substrate having an amorphous silicon film or a polycrystalline silicon film formed in one principal surface thereof; and scanning a desired region of the amorphous silicon film or the polycrystalline silicon film on the substrate while irradiating the desired region with a laser beam shaped into a long and narrow shape; wherein in order to scan the substrate with the laser beam in a plurality of directions, the laser beam shaped into the long and narrow shape is rotated around an optical axis of the laser beam without rotating the substrate, while the stage mounted with the substrate is moved only in two directions crossing each other at right angles, so that the desired region can be irradiated at any position and in any direction with the laser beam shaped into the long and narrow shape.

(9) In the configuration of the paragraph (8), the laser beam to irradiate the substrate having the amorphous silicon film or the polycrystalline silicon film on the principal surface is a continuous wave laser beam modulated temporally in amplitude and shaped into a long and narrow shape.

(10) In the configuration of the paragraph (8), the laser beam to irradiate the substrate having the amorphous silicon film or the polycrystalline silicon film on the principal surface is a laser beam pulsed and shaped into a long and narrow shape.

Incidentally, the present invention is not limited to any one of the aforementioned configurations or any one of configurations according to embodiments which will be described later. Not to say, various changes can be made on the present invention without departing from its technical concept.

As described above, according to the laser annealing apparatus and the laser annealing method according to the present invention, annealing by scanning a substrate with a laser beam in two directions crossing each other at right angles can be performed only by changing the moving direction of the substrate without rotating the substrate. That is, as a stage for high-speed or high-accuracy scanning of a substrate mounted thereon, it will go well if the stage is driven in the X- and Y-directions. It is not necessary to place a rotary stage on an XY stage. Accordingly, a load on the XY stage can be reduced so that the life of the stage can be extended, and hence the apparatus cost can be reduced. If the substrate is rotated, it will be necessary to perform realignment so that the throughput will be lowered. However, when the optical axis of the laser beam is rotated, it is not necessary to perform realignment. Thus, the present invention is effective also in terms of improvement in throughput.

BRIEF DESCRIPTION OF THE DRAWINGS

These and other features, objects and advantages of the present invention will become more apparent from the following description when taken in conjunction with the accompanying drawings wherein:

FIGS. 2A and 2B are views for explaining a homogenizer using a Powell's lens system, which homogenizer can be used in the laser annealing apparatus according to the embodiment of the present invention;

FIGS. 4A and 4B are views for explaining a homogenizer using a diffractive optical element system, which homogenizer can be used in the laser annealing apparatus according to the embodiment of the present invention;

FIGS. 5A and 5B are views for explaining a homogenizer using a multi-lens array system, which homogenizer can be used in the laser annealing apparatus according to the embodiment of the present invention;

FIG. 6 is a view showing the configuration of an optical system of a laser annealing apparatus according to another embodiment of the present invention;

DETAILED DESCRIPTION OF PREFERRED EMBODIMENTS

Specific embodiments of the present invention will be described below in detail with reference to the drawings of the embodiments.

Embodiment 1

Figure 1:
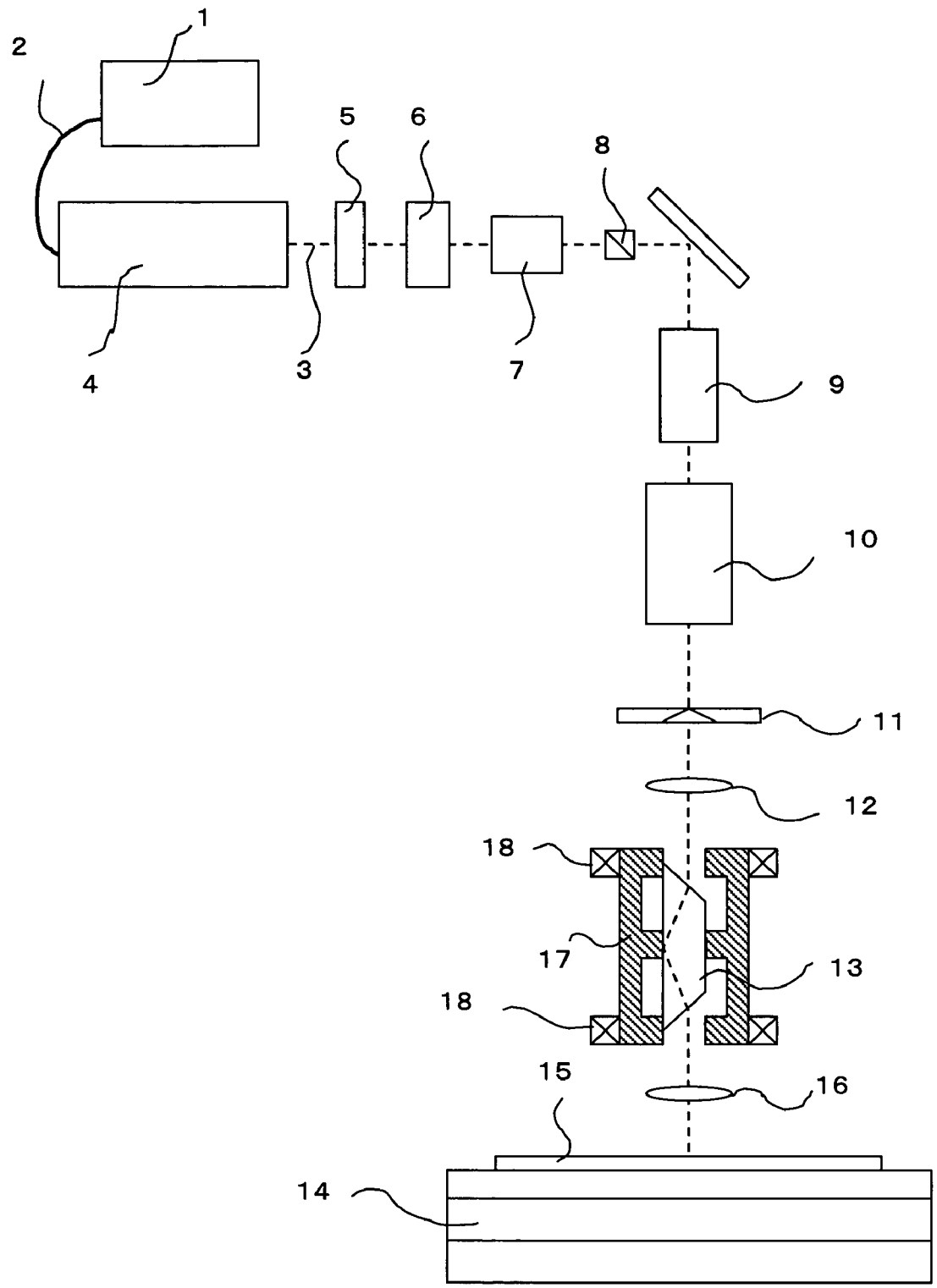
FIG. 1 is a view showing the configuration of an optical system of a laser annealing apparatus according to an embodiment of the present invention.

An embodiment of the present invention will be described below in detail with reference to the drawings. FIG. 1 is a view showing the configuration of an optical system of a laser annealing apparatus according to Embodiment 1 of the present invention. In FIG. 1, the laser annealing apparatus is constituted by a laser oscillator 4 coupled with a pumping LD (Laser Diode) 1 though a fiber 2 and for generating a continuous wave laser beam 3, a shutter 5 for turning on/off the laser beam 3, a continuously variable transmittance ND filter 6 for adjusting the energy of the laser beam 3, an electro-optic modulator (hereinafter referred to as "EO modulator") 7 for pulsing the laser beam 3 output from the laser oscillator 4 and temporally amplitude modulating the energy of the laser beam 3, a polarized beam splitter 8, a beam expander (or beam reducer) 9 for adjusting the beam diameter of the laser beam 3, a beam shaper (beam homogenizer) 10 for shaping the laser beam 3 into a long and narrow (linear) beam, a rectangular opening slit 11 for sizing the shaped laser beam 3 into a predetermined size, a relay lens 12 for converting the beam shaped linearly by the beam shaper 10 to a collimated beam, an image rotator 13 for rotating the transmitted beam around the optical axis thereof, a container 17 receiving the image rotator 13 and designed to be rotatable by means of rotary bearings 18 and 18' or the like, and an imaging lens 16 for imaging an image transported from the relay lens 12 onto a substrate 15 mounted on an XY stage 14.

Next, detailed description will be made about the operation and function of each part. It is desired that the continuous wave laser beam 3 has a wavelength (from an ultraviolet wavelength to a visible light wavelength) which is absorbable in an amorphous silicon thin film or a polycrystalline silicon thin film to be annealed. More specifically, an Ar laser or a Kr laser and a second harmonic thereof, second and third harmonics of an Nd:YAG laser, an Nd:YVO$_4$ laser, an Nd YLF laser or the like, etc. are applicable. In consideration of output capacity and stability, a second harmonic (wavelength 532 nm) of an LD (Laser Diode) pumped Nd:YAG laser or a second harmonic (wavelength 532 nm) of an LD pumped Nd:YVO$_4$ laser is the most desired.

A laser beam generated from such an oscillator is circular with a Gaussian energy distribution. Description will be made below about the case where a second harmonic of an LD pumped continuous wave Nd:YVO$_4$ laser is used.

The laser beam 3 oscillated from the laser oscillator 4 is turned on/off by the shutter 5. That is, the laser oscillator 4 is always made to oscillate the laser beam 3 at a fixed power level, while the shutter 5 is normally closed (turned off) so that the laser beam 3 is blocked by the shutter 5. Only for irradiation with the laser beam 3, the shutter 5 is opened (turned on) to output the laser beam 3. The laser beam 3 can be turned on/off if the pumping LD 1 is turned on/off, but such a manner is not desired to secure stability in the laser output. Also when the irradiation with the laser beam 3 is to be stopped for safety reasons, the shutter 5 may be closed.

The laser beam 3 passing through the shutter 5 transmits the continuously variable transmittance ND filter 6 serving to adjust the output. Then, the laser beam 3 enters the EO modulator 7. Due to a voltage applied to a Pockels cell (crystal) through a driver (not shown), the EO modulator 7 rotates the polarized direction of the laser beam 3 passing through the crystal. In addition, by the polarized beam splitter 8 placed at the rear of the crystal, only a P-polarized component is transmitted while an S-polarized component is deflected at an angle of 90 degrees. Thus, the laser beam 3 is turned on/off.

That is, a voltage V1 for rotating the polarized direction of the laser beam 3 to thereby enter the polarized beam splitter 8 as P-polarized light and a voltage V2 for rotating the polarized direction of the laser beam 3 to thereby enter the polarized beam splitter 8 as S-polarized light are applied alternately to temporally modulate in amplitude the laser beam 3. Not to say, when a desired voltage between the voltage V1 and the voltage V2 is applied, the output can be set desirably. Although description in FIG. 1 has been made using a combination of the Pockels cell 7 and the polarized beam splitter 8 as the EO modulator, various polarizing elements may be used instead of the polarized beam splitter. In the following description, the combination of the Pockels cell 7 and the polarized beam splitter 8 (or various polarizing elements) will be also referred to as "EO modulator".

In place of the EO modulator, an AO (Acousto-optical) modulator may be used. Generally the driving frequency of the AO modulator is lower than that of the EO modulator, and the diffraction efficiency of the AO modulator is also lower to be 70% to 90% of that of the EO modulator. However, the AO modulator is characterized in that the AO modulator can turn on/off even the laser beam 3 which is not linearly polarized light. When the EO modulator 7 or another modulator such as an AO modulator is used, a temporally modulated in amplitude laser beam having a desired wave form (temporally varied energy) can be obtained from a continuous wave laser beam at a desired timing. That is, desired temporal amplitude modulation can be performed.

The beam diameter of the temporally modulated in amplitude laser beam 3 is adjusted by the beam expander (or beam reducer) 9 for adjusting the beam diameter, and the laser beam 3 then enters the beam shaper 10. The beam shaper 10 is an optical element for shaping the laser beam 3 into a beam having a long and narrow shape. Here, the long and narrow shape means a linear shape, a rectangular shape, an elliptic shape or an ellipsoidal shape. A gas laser or a solid-state laser generally outputs a circular beam having a Gaussian energy distribution, which cannot be used directly for laser annealing according to the present invention. If the oscillator power is high enough, a substantially uniform energy distribution can be obtained when only a comparatively uniform portion is extracted from the central portion of a beam whose diameter is expanded sufficiently. However, the circumferential portion of the beam is abandoned. Thus, a major part of the energy is wasted. In order to solve the problem, the beam shaper (beam homogenizer) 10 is used for converting the Gaussian distribution into a uniform distribution (flat top). The beam shaper 10 is defined as a beam shaper for converting the energy distribution of a beam output from the laser oscillator 4 into that of a beam having a long and narrow shape suitable for laser annealing.

Figures 3A, 3B:
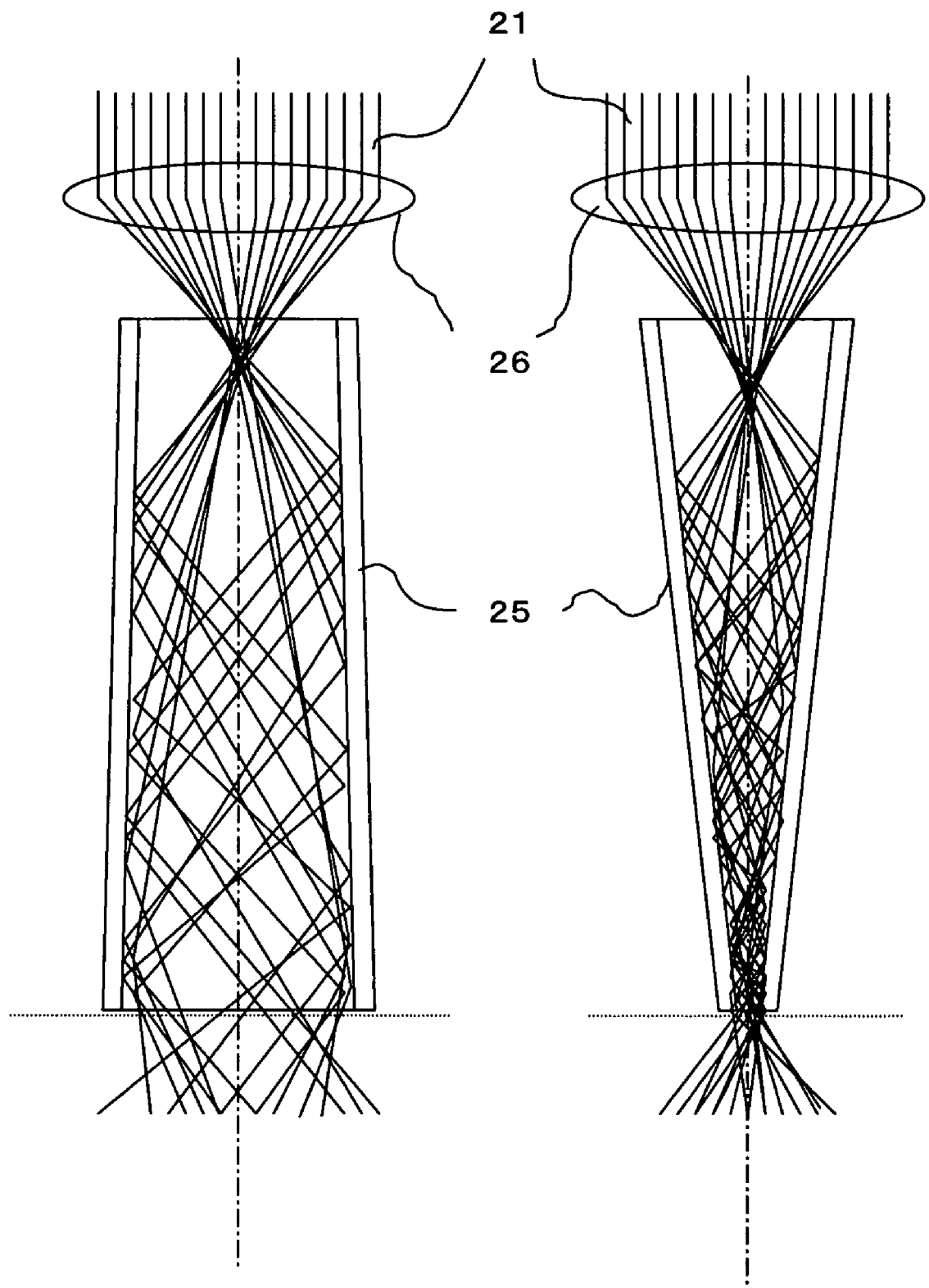
FIGS. 3A and 3B are views for explaining a homogenizer using a kaleidoscope system, which homogenizer can be used in the laser annealing apparatus according to the embodiment of the present invention.

FIGS. 2A and 2B are views for explaining a homogenizer using a Powell's lens system, which homogenizer can be used in the laser annealing apparatus according to Embodiment 1 of the present invention. FIGS. 3A and 3B are views for explaining a homogenizer using a kaleidoscope system, which homogenizer can be used in the laser annealing apparatus according to Embodiment 1 of the present invention. FIGS. 4A and 4B are views for explaining a homogenizer using a diffractive optical element system, which homogenizer can be used in the laser annealing apparatus according to Embodiment 1 of the present invention. FIGS. 5A and 5B are views for explaining a homogenizer using a multi-lens array system, which homogenizer can be used in the laser annealing apparatus according to Embodiment 1 of the present invention.

A combination of a Powell's lens 22 and a cylindrical lens 23 shown in FIGS. 2A and 2B, a kaleidoscope shown in FIGS. 3A and 3B, a diffractive optical element shown in FIGS. 4A and 4B, and a combination of a multi-lens array and convex lenses shown in FIGS. 5A and 5B can be used as the beam homogenizer 10 in FIG. 1.

The beam shaper 10 shown in FIGS. 2A and 2B is comprised of a Powell's lens 22 and a cylindrical lens (columnar lens) 23. The Powell's lens 22 is a kind of cylindrical lens, by which a laser beam 21 having a Gaussian distribution and entering the lens as shown in FIG. 2A is imaged on the plane of projection (the plane of the rectangular opening slit 11 in FIG. 1) so that the central portion with high energy density with respect to one axial direction becomes sparse while the peripheral portion with low energy density becomes dense.

As for a direction perpendicular to the plane shown in FIG. 2A, that is, a direction perpendicular to the paper, there appears no change in the energy distribution by means of the Powell's lens alone. Accordingly, as shown in FIG. 2B, light in such a direction is condensed by the cylindrical lens 23. As a result, a long and narrow beam having a uniform energy distribution in its longitudinal direction (the direction shown in FIG. 2A) and a Gaussian distribution in its lateral direction (the direction shown in FIG. 2B) is formed on the plane of the rectangular opening slit 11. A circumferential portion or a skirt portion of the beam having a large change in energy density is blocked by the rectangular opening slit 11 in accordance with necessity. Thus, a laser beam with a long and narrow shape having an energy distribution with a sharp leading edge can be obtained.

A kaleidoscope 25 shown in FIGS. 3A and 3B is formed into a cylindrical shape having a circular, elliptic or rectangular shape on the entrance side of the laser beam 21 and a desired shape (a long and narrow shape in this embodiment) on the exit side of the laser beam 21, and having a continuous change between the entrance side and the exit side. The kaleidoscope 25 has an inner surface which can subject the laser beam 21 to multiple and diffused reflection. The laser beam 21 is introduced into the kaleidoscope 25 while converging or diverging due to a lens 26 in accordance with necessity. The laser beam 21 repeats reflection on the inner surface of the kaleidoscope 25. Finally the laser beam 21 is output from an outlet of the kaleidoscope 25 so as to have a shape formed correspondingly to the shape of the outlet. In this case, the outlet of the kaleidoscope 25 can be used as the rectangular opening slit. Although a hollow kaleidoscope is shown in FIGS. 3A and 3B, the internal portion of the kaleidoscope maybe made of a transparent material such as glass or quartz.

A diffractive optical element 28 shown in FIGS. 4A and 4B is designed so that the laser beam 21 having a Gaussian distribution and entering the diffractive optical element 28 is condensed to have a uniform distribution in one direction (the direction shown in FIG. 4A) and a Gaussian distribution in a direction (the direction shown in FIG. 4B) perpendicular to the one direction. That is, the diffractive optical element 28 is arranged as follows. That is, minute steps are formed in a substrate of quartz or the like by a photo-etching process, so that diffraction patterns formed by laser beam components penetrating the steps respectively are combined in an imaging plane (identical with the plane of the rectangular opening slit 11 in this embodiment). Thus, a desired energy distribution can be obtained on the imaging plane (the plane of the rectangular opening slit 11).

A homogenizer of a multi-lens array system shown in FIGS. 5A and 5B is constituted by a multi-lens array (comprised of a multi-cylindrical-lens array 31 in FIGS. 5A and 5B), a relay lens 32 and a cylindrical lens 33. The laser beam 21 enters the multi-lens array 31 in the direction shown in FIG. 5A. Laser beam components passing through lenses of the multi-lens array 31 respectively are projected on an imaging plane (the plane of the rectangular opening slit 11) by the relay lens 32 so as to form a uniform energy distribution.

On the other hand, as for the direction perpendicular to the plane shown in FIG. 5A, the laser beam 21 is condensed by the cylindrical lens 33 as shown in FIG. 5B, so that a Gaussian energy distribution can be obtained on the imaging plane (the plane of the rectangular opening slit 11). A circumferential portion or a skirt portion of the projected beam having a large change in energy density is blocked by the rectangular opening slit 11 in accordance with necessity. Thus, an energy distribution with a sharp leading edge can be obtained.

In addition, when an oscillator 4 having enough high energy is used, the beam diameter of the laser beam 21 may be expanded sufficiently so that a necessary beam portion cut therefrom by a rectangular opening slit can be used. In this case, means for cutting out the beam, for example, an aperture or a slit having a rectangular shape, a linear shape, an elliptic shape, an ellipsoidal shape or the like serves as the beam shaper 10. Without regard to uniformity of energy density, a cylindrical lens may be used as the beam shaper 10. In this case, the laser beam is simply compressed in one direction. Accordingly, the compression direction is set as a lateral direction so that the energy distribution in the compression direction is left as a Gaussian distribution, while the energy distribution in the direction perpendicular thereto is also left as a Gaussian distribution of the original beam. Then, a central portion cut out by an aperture or a slit may be used in accordance with necessity.

Referring to FIG. 1 again, the long and narrow beam obtained by the beam shaper 10 is converted into a collimated beam by the relay lens (also referred to as "tube lens") 12. After penetrating the image rotator 13, the laser beam is condensed and radiated onto the substrate 15 mounted on the XY stage 14, by the imaging lens 16, as a projected image of the beam shaped by the rectangular opening slit 11 or the beam shaper 10. When the focal length of the imaging lens 16 is enough long, the image rotator 13 may be disposed between the beam shaper 10 and the imaging lens 16 without using the relay lens 12. If the relay lens 12 is placed, there will be no change in size or energy density of the long and narrow beam projected onto the substrate even when the distance between the relay lens 12 and the imaging lens 16 is changed. Accordingly, in this case, an observing optics or an energy monitoring optics (not shown here) can be inserted between the relay lens 12 and the imaging lens 16 in accordance with necessity.

For example, a prism called a dove prism can be used as the image rotator 13. When the dove prism is placed rotatably around an optical axis, light transmitted by the dove prism can be rotated at an angle twice as large as the rotation angle of the dove prism. That is, when the dove prism is received in a cylindrical container 17 retained by a rotary bearing 18 or the like, the dove prism can be rotated easily. When the dove prism is rotated at an angle of 45 degrees, light transmitted by the dove prism can be rotated at an angle of 90 degrees. In the case of this embodiment, a long and narrow beam can be rotated at an angle of 90 degrees around its optical axis on the substrate 15. That is, the annealing apparatus according to the present invention is designed so that a laser beam shaped into along and narrow shape can be rotated desirably with respect to the longitudinal direction of the long and narrow shape when a substrate is irradiated with the laser beam. Although no mechanism for driving and rotating the image rotator 13 is shown in FIG. 1, a motor maybe connected directly to the image rotator 13 or torque of the motor may be transmitted thereto through a gear, a belt or the like.

Scanning with the laser beam in a direction other than two directions crossing each other at right angles, for example, in the direction of 45 degrees with respect to an outer shape of the substrate, can be achieved as follows. That is, the image rotator 13 is rotated at an angle of 22.5 degrees so as to rotate the long and narrow beam at an angle of 45 degrees, and the stage is moved at a constant speed in the X-direction and the Y-direction. Scanning in a direction of any angle other than 45 degrees can be achieved by the following control. That is, the lateral direction of the long and narrow beam is rotated to follow the scanning direction, while a composite vector of X- and Y-direction velocity vectors is set to follow the scanning direction.

In place of the dove prism, reflecting mirrors may be combined to attain the same function as the dove prism. That is, refraction and reflection of a laser beam due to the dove prism can be attained by only reflection due to reflecting mirrors.

Embodiment 2

Next, description will be made about Embodiment 2 according to the present invention. FIG. 6 is a view showing the configuration of an optical system of a laser annealing apparatus according to Embodiment 2 of the present invention. Incidentally, parts the same as those in FIG. 1 are denoted by the same reference numerals correspondingly. In FIG. 6, the laser annealing apparatus is constituted by a laser oscillator 4 coupled with a pumping LD (Laser Diode) 1 though a fiber 2 and for generating a continuously wave laser beam 3, a shutter 5 for turning on/off the laser beam 3, a continuously variable transmittance ND filter 6 for adjusting the energy of the laser beam 3, an electro-optic modulator (hereinafter referred to as "EO modulator") 7 for pulsing the laser beam 3 output from the laser oscillator 4 and temporally amplitude modulating the energy of the laser beam 3, a polarized beam splitter 8, a beam expander (or beam reducer) 9 for adjusting the beam diameter of the laser beam 3, a beam shaper 10 for shaping the laser beam 3 into along and narrow beam, a rectangular opening slit 11 for sizing the shaped laser beam 3 into a predetermined size, an image lens 16 for imaging an image of the rectangular opening slit 11 onto a substrate 15 mounted on an XY stage 14, and a container 67 receiving the beam shaper 10 and designed to be rotatable by means of a rotary bearing 68 and so on.

Next, detailed description will be made about the operation and function of each part in FIG. 6. The continuous wave laser beam 3 has a wavelength (preferably from an ultraviolet wavelength to a visible light wavelength) which is absorbable in an amorphous silicon thin film or a polycrystalline silicon thin film to be annealed. More specifically, an Ar laser or a Kr laser and a second harmonic thereof, second and third harmonics of an Nd:YAG laser, an Nd:YVO$_4$ laser, an Nd YLF laser or the like, etc. are applicable. In consideration of output capacity and stability, a second harmonic (wavelength 532 nm) of an LD (Laser Diode) pumped Nd:YAG laser or a second harmonic (wavelength 532 nm) of an LD pumped Nd:YVO$_4$ laser is the most desired. A laser beam generated from such an oscillator is circular with a Gaussian energy distribution. Description will be made below about the case where a second harmonic of an LD pumped continuous wave Nd:YVO$_4$ laser is used.

The laser beam 3 oscillated from the laser oscillator 4 is turned on/off by the shutter 5. That is, the laser oscillator 4 is always made to oscillate the laser beam 3 at a fixed power level, while the shutter 5 is normally closed (turned off) so that the laser beam 3 is blocked by the shutter 5. Only for irradiation with the laser beam 3, the shutter 5 is opened (turned on) to output the laser beam 3. The laser beam 3 can be turned on/off if the pumping LD 1 is turned on/off, but such a manner is not desired to secure stability in the laser output. Also when the irradiation with the laser beam 3 is to be stopped for safety reasons, the shutter 5 may be closed.

The laser beam 3 passing through the shutter 5 transmits the continuously variable transmittance ND filter 6 serving to adjust the output. Then, the laser beam 3 enters the EO modulator 7. Due to a voltage applied to a Pockels cell (crystal) through a driver (not shown), the EO modulator 7 rotates the polarized direction of the laser beam 3 passing through the crystal. By the polarized beam splitter 8 placed at the rear of the crystal, only a P-polarized component is transmitted while an S-polarized component is deflected at an angle of 90 degrees. Thus, the laser beam 3 is turned on/off. That is, a voltage V1 for rotating the polarized direction of the laser beam 3 to thereby enter the polarized beam splitter 8 as P-polarized light and a voltage V2 for rotating the polarized direction of the laser beam 3 to thereby enter the polarized beam splitter 8 as S-polarized light are applied alternately to temporally modulate in amplitude the laser beam 3. Not to say, when a desired voltage between the voltage V1 and the voltage V2 is applied, the output can be set desirably.

Although description in FIG. 6 has been made using a combination of the Pockels cell 7 and the polarized beam splitter 8 as the EO modulator, various polarizing elements may be used instead of the polarized beam splitter. In the following description, the combination of the Pockels cell 7 and the polarized beam splitter 8 (or various polarizing elements) will be also referred to as "EO modulator".

In place of the EO modulator, an AO (Acousto-optical) modulator may be used. Generally the driving frequency of the AO modulator is lower than that of the EO modulator, and the diffraction efficiency of the AO modulator is also lower to be 70% to 90% of that of the EO modulator. However, the AO modulator is characterized in that the AO modulator can turn on/off even the laser beam 3 which is not linearly polarized light. When the EO modulator 7 or another modulator such as an AO modulator is used, a temporally modulated in amplitude laser beam having a desired waveform (temporally varied energy) can be obtained from a continuous wave laser beam at a desired timing. That is, desired temporal amplitude modulation can be performed.

The beam diameter of the temporally modulated in amplitude laser beam 3 is adjusted by the beam expander (or beam reducer) 9 for adjusting the beam diameter, and the laser beam 3 then enters the beam shaper 10. The beam shaper 10 is an optical element for shaping the laser beam 3 into a beam having a long and narrow shape. Here, the long and narrow shape means a linear shape, a rectangular shape, an elliptic shape or an ellipsoidal shape. A gas laser or a solid-state laser generally outputs a circular beam having a Gaussian energy distribution, which cannot be used directly for laser annealing according to the present invention. If the oscillator power is high enough, a substantially uniform energy distribution can be obtained when only a comparatively uniform portion is extracted from the central portion of the beam whose diameter is expanded sufficiently. However, the peripheral portion of the beam is abandoned. Thus, a major part of the energy is wasted. In order to solve the problem, the beam shaper 10 is used for converting the Gaussian distribution into a uniform distribution (flat top).

A combination of a Powell's lens and a cylindrical lens shown in FIGS. 2A and 2B, a kaleidoscope shown in FIGS. 3A and 3B, a diffractive optical element shown in FIGS. 4A and 4B, and a combination of a multi-lens (cylindrical lens) array and cylindrical lenses shown in FIGS. 5A and 5B can be used as the beam shaper 10. In addition, when an oscillator 4 having enough high energy is used, the beam diameter may be expanded sufficiently so that a necessary beam portion cut therefrom by a rectangular opening slit can be used. In this case, means for cutting out the beam, for example, an aperture or a slit having a rectangular shape, a linear shape, an elliptic shape, an ellipsoidal shape or the like serves as the beam shaper 10.

Without regard to uniformity of energy density, a cylindrical lens may be used as the beam shaper 10. In this case, the laser beam is simply compressed in one direction. Accordingly, the one direction is set as a lateral direction, while the energy distribution in the direction perpendicular to the one direction is left as a Gaussian distribution of the original beam. Then, a central portion cut out may be used in accordance with necessity. Of these beam shapers, the diffractive optical element is the most excellent because it has a simple configuration and can obtain a desired shape and a desired energy distribution.

The long and narrow beam obtained by the beam shaper 10 is condensed and radiated onto the substrate 15 mounted on the XY stage 14, by the imaging lens 16, as a projected image of the laser beam shaped by the rectangular opening slit 11 or the beam shaper 10. Here, the laser beam shaped into the long and narrow shape by the beam shaper 10 may be converted into a collimated beam by a relay lens (also referred to as "tube lens") before the laser beam is projected onto the substrate by the imaging lens 16 as a long and narrow beam. In this case, there will be no change in size or energy density of the long and narrow beam projected onto the substrate even when the distance between the relay lens and the imaging lens is changed. Accordingly, in this case where the relay lens is settled, an observing optics or an energy monitoring optics can be inserted between the relay lens and the imaging lens 16 in accordance with necessity.

The beam shaper 10 is received in a cylindrical container 67 retained by rotary bearings 68 and 68' or the like so that the beam shaper 10 can be rotated easily. When the beam shaper 10 is rotated with the rotation center of the beam shaper 10 coinciding with the optical axis of the laser beam, the laser beam passing through the beam shaper 10 can be rotated.

In the case of this embodiment, when the container 67 is rotated at an angle of 90 degrees, a linear (rectangular) beam can be rotated at an angle of 90 degrees on the substrate 15. That is, the annealing apparatus according to the present invention is designed so that a laser beam shaped into a long and narrow shape can be rotated desirably with respect to the longitudinal direction of the long and narrow shape when a substrate is irradiated with the laser beam shaped into the long and narrow shape. Although no mechanism for driving and rotating the container 67 is shown in FIG. 6, a motor may be connected directly to the container 67 or torque of the motor may be transmitted thereto through a gear, a belt or the like. In the description of the embodiment shown in FIG. 6, the X-direction size and the Y-direction size of the rectangular opening slit 11 have to be replaced by each other when the container receiving the beam shaper 10 is rotated at an angle of 90 degrees in order to rotate the beam shaped into a long and narrow shape. This is not applied to the case where the rectangular opening slit 11 is not used.

Scanning with the laser beam in a direction other than two directions crossing each other at right angles, for example, in the direction of 45 degrees with respect to an outer shape of the substrate, can be achieved as follows. That is, the beam shaper is rotated at an angle of 45 degrees so as to rotate the long and narrow beam at an angle of 45 degrees, and the stage 14 is moved at a constant speed in the X-direction and the Y-direction. Scanning in a direction of any angle other than 45 degrees can be achieved by the following control. That is, the lateral direction of the long and narrow beam is aligned with the scanning direction, and the stage 14 is moved so that a composite vector of X-and Y-direction velocity vectors follows the scanning direction. In this case, the rectangular opening slit 11 may be rotated at the same angle as the beam shaper 10. When the rectangular opening slit 11 is not rotated, measures to open the rectangular opening slit 11 so as to prevent it from blocking the beam may be taken, or the rectangular opening slit 11 may be adjusted to have a desired length with the angle as it is. Alternatively, the rectangular opening slit 11 may be rotated at a desired angle together with the beam shaper 10.

Embodiment 3

Figure 7A:
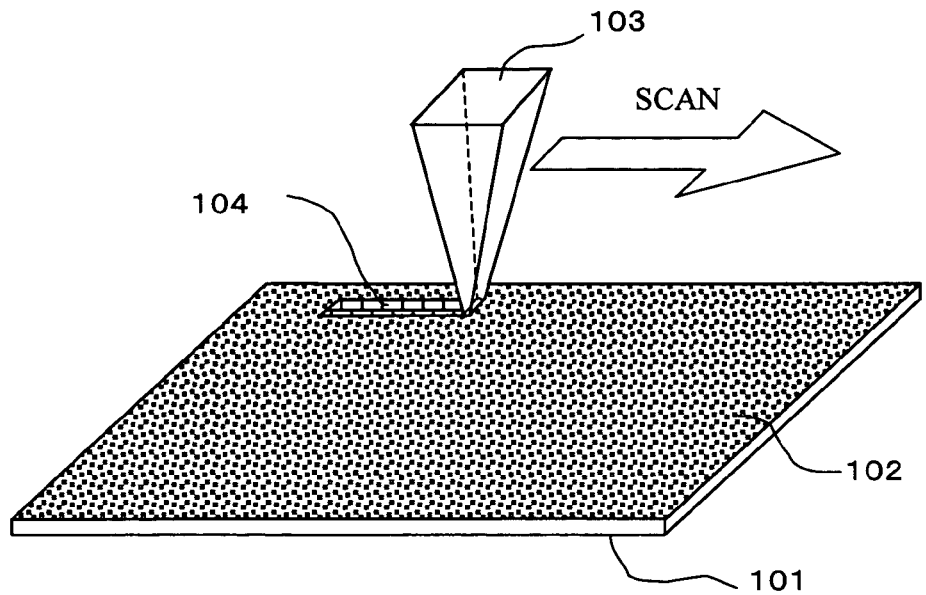
FIGS. 7A-7C are views for explaining an embodiment of a laser annealing method according to the present invention.
Figure 7B:
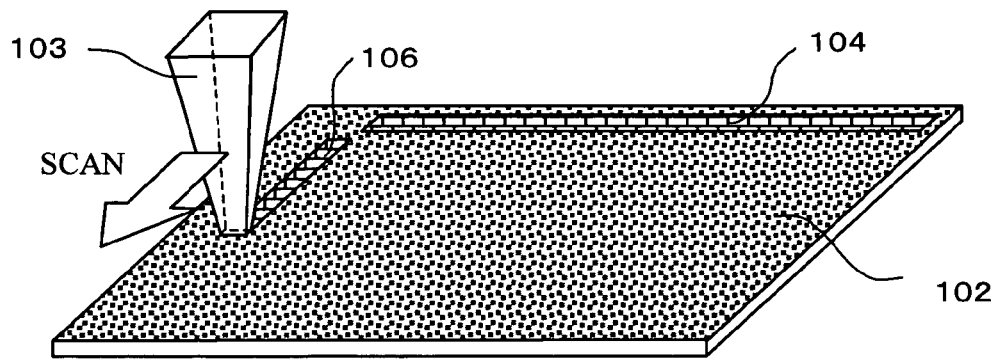
Figure 7C:
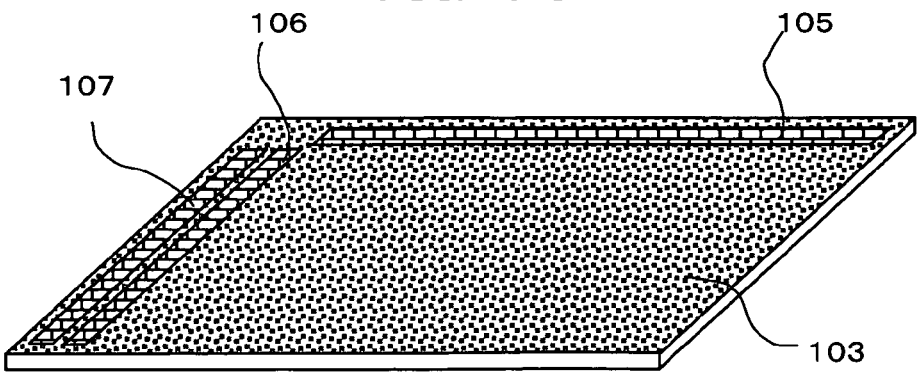

Next, an embodiment of a laser annealing method according to the present invention to be carried out using the aforementioned laser annealing apparatus will be described as Embodiment 3 of the invention. The description will be made with reference to FIG. 1 and FIGS. 7A-7C. FIGS. 7A-7C are views for explaining the embodiment of the laser annealing method according to the present invention. Here, a polycrystalline silicon thin film substrate is used as the substrate 15 (FIG. 1). The polycrystalline silicon thin film substrate is obtained as follows. That is, an amorphous silicon thin film is formed on one principal surface of a glass substrate 101 through an insulator thin film (not shown). The whole surface of the amorphous silicon thin film is scanned with an excimer laser beam so as to be crystallized as a polycrystalline silicon thin film 102. Here, the insulator thin film is an $SiO_2$ film, an SiN film, or a composite film of those. The polycrystalline silicon thin film substrate 15 is mounted and fixed onto the XY stage 14 by a conveyance robot or the like.

Alignment marks are formed at a plurality of places on the polycrystalline silicon thin film substrate 15 by a laser beam to be used for annealing or another laser beam separately provided for forming alignment marks. Alignment is performed by detecting the alignment marks formed thus. The alignment marks may be formed in a photo-etching process in advance or formed in another manner such as inkjet printing. When the alignment marks are not used, alignment may be performed by pressing an end face of the substrate 15 against pins (not shown) or the like disposed on the XY stage 14. Further, after alignment is performed by pressing an end face of the substrate 15 against pins (not shown) or the like disposed on the stage and laser annealing is completed on all of predetermined regions, alignment marks may be formed in positions having a certain relation to the annealed regions respectively.

The alignment marks may be used only for positioning for exposure (positioning a photo-mask) in a first photo-resist process (normally a silicon thin film etching process) after the laser annealing process. In each subsequent photo-resist process, alignment marks formed newly in the first photo-resist process are used.

With reference to the position of a detected alignment mark, a drain (signal wire) driver circuit portion 104 is first scanned and irradiated with a laser beam 103 in accordance with coordinates on design as shown in FIG. 7A.

The laser beam cut out at a desired irradiation time interval by the EO modulator 7 is shaped into a linear energy distribution by the beam shaper 10 and passed through the rectangular opening slit 11, the relay lens 12 and the image rotator 13. Then, the polycrystalline silicon thin film 102 is irradiated with the laser beam 103 formed into a long and narrow beam by the imaging lens 16. In this event, the XY stage 14 is moved at a high speed so as to move the long and narrow beam in a direction (lateral direction) perpendicular to the longitudinal direction thereof. Thus, a region to be annealed can be scanned. In addition, the long and narrow beam in this event is shaped to be 10 mm long or shorter, preferably 2 mm to 5 mm long in the lateral direction (width direction), but the length in the longitudinal direction depends on the output power of the laser oscillator. When the continuous wave output power is 10 W, the long and narrow beam is shaped to be several hundreds of millimeters to several millimeters long in the longitudinal direction.

Here, according to the lower limit of the lateral size described above, light is condensed so minutely that the focal depth becomes shallow. As a result, defocusing occurs due to a swell of the substrate or the like so that the energy density is lowered. Thus, superior annealing cannot be performed. This limit can be ignored when an automatic focusing mechanism is added or when the displacement of the substrate surface is measured in advance so that the substrate surface can be always kept within the focal depth of an objective lens (projecting lens). The scanning speed depends on the silicon film thickness or the lateral size of the long and narrow beam, but it is preferably in a range of from 300 mm/s to 1,000 mm/s. Although the laser beam 103 is illustrated in FIGS. 7A-7C as if it is moving, the stage 14 (that is, the substrate 15) may be moved.

Figure 8A:
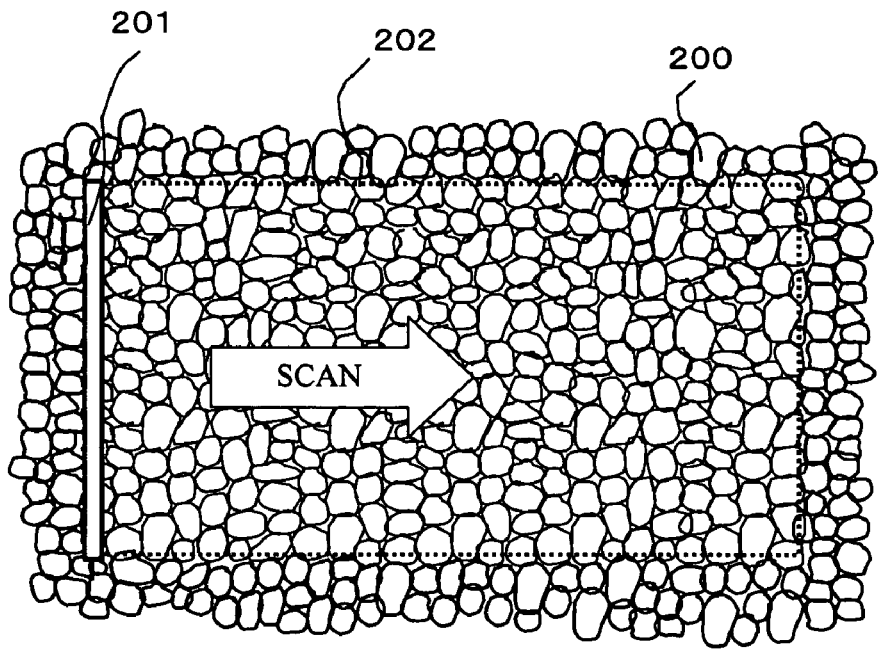
FIGS. 8A and 8B are views showing a process for irradiating a polycrystalline silicon substrate with a shaped beam so as to form belt-like crystals therein.
Figure 8B:
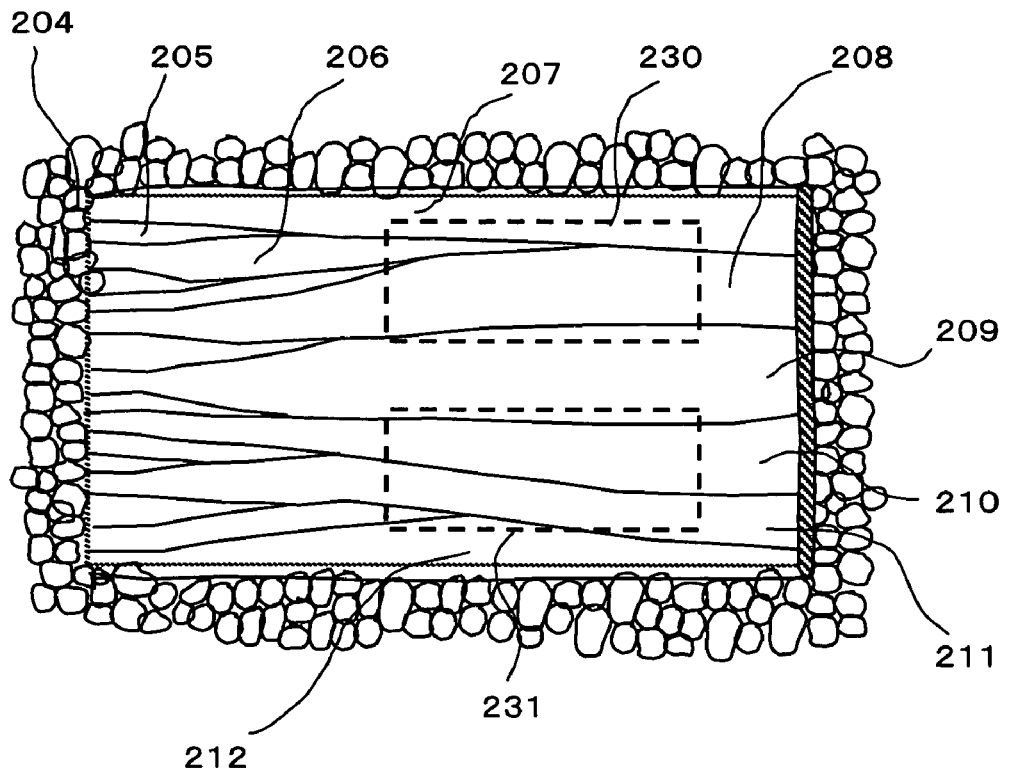
Figure 9A:
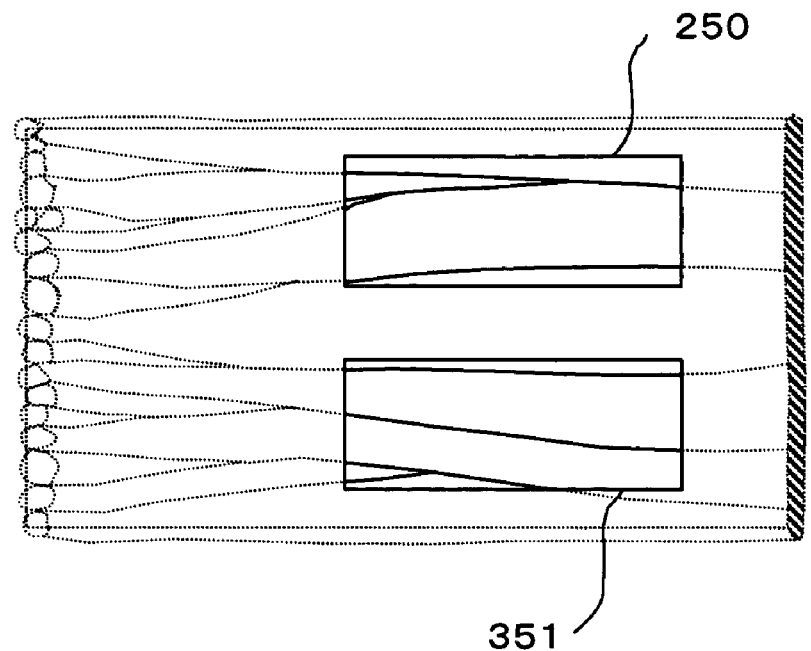
FIGS. 9A and 9B are views showing a process for forming a thin film transistor out of a belt-like crystal formed in the process shown in FIGS. 8A and 8B.
Figure 9B:
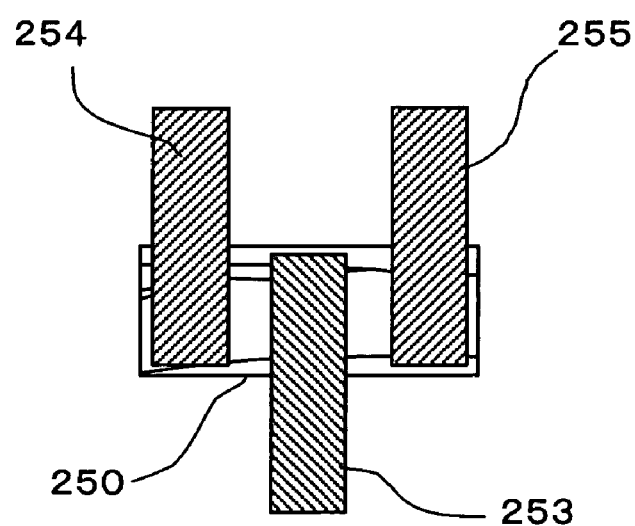

Here, the behavior of a polycrystalline silicon thin film scanned and irradiated with a continuous wave laser beam modulated temporally in amplitude and shaped into a long and narrow beam shape will be described with reference to FIGS. 8A and 8B. FIGS. 8A and 8B are views showing a process for irradiating a polycrystalline silicon film substrate with a beam shaped into a long and narrow shape, so as to form belt-like crystals therein. FIGS. 9A and 9B are views showing a process for forming a thin film transistor out of a belt-like crystal formed thus. As shown in FIG. 8A, while a polycrystalline silicon film 200 is scanned with a laser beam 201 shaped into a long and narrow shape, a region 202 is irradiated with the laser beam 201. When irradiated with a proper power density, the polycrystalline silicon film 200 other than the laser-irradiated region 202 is left as it is, but the polycrystalline silicon film in the laser-irradiated region 202 is fused.

After that, when the laser beam 201 has gone through the polycrystalline silicon film, the fused polycrystalline silicon film is solidified and crystallized rapidly. In this event, as shown in FIG. 8B, cooling and solidification start at silicon in a region fused earliest in the portion where the irradiation was initiated. For example, a crystal grain 204 abutting against the laser-irradiated region 202 serves as a seed crystal, with which a crystal grows up in the scanning direction of the laser beam. However, the growth rate of each crystal depends on its crystal orientation. Therefore, finally only crystal grains having a crystal orientation resulting in the highest growth rate keep growing.

That is, as shown in FIG. 8B, the growth of a crystal grain 205 having a crystal orientation resulting in a lower growth rate is suppressed by the growth of surrounding crystal grains 206 and 207 each having a crystal orientation resulting in a higher growth rate. Thus, the crystal grain 205 stops its growth. On the other hand, the crystal grain 206 having a crystal orientation resulting in a middle growth rate keeps growing, but the growth of the crystal grain 206 is suppressed by the growth of crystal grains 207 and 208 each having a crystal orientation resulting in a higher growth rate. Thus, the crystal grain 206 stops its growth soon. Finally the crystal grains 207 and 208 each having a crystal orientation resulting in the highest growth rate keep growing.

However, those crystal grains do not grow infinitely. When the crystal grains grow to be 5-50 microns long, their growth may be suppressed by crystal grains beginning growing newly, or may be divided into a plurality of crystal grains. As a result, crystal grains 0.2-2 microns wide and 5-50 microns long are obtained. Of them, crystal grains 207, 208, 209, 210, 211 and 212 having kept growing to the last are independent crystal grains in the strict sense. However, the crystal grains 207, 208, 209, 210, 211 and 212 have almost the same crystal orientation. Thus, in the portions of them fused once and then recrystallized, silicon crystals grow laterally so as to form a polycrystalline film composed of belt-like crystal grains. This polycrystalline film can be effectively regarded as a substantially single crystal (quasi-single crystal). In addition, the roughness in the surface after laser annealing is 10 nm or lower. Thus, the surface is extremely flat.

When the polycrystalline silicon thin film 200 is irradiated with the laser beam 201 in the aforementioned manner, regions 202 irradiated with the laser beam 201 are annealed like islands (or like tiles), and only crystal grains having a specific crystal orientation grow up. Thus, a region which is polycrystalline in the strict sense but has a property close to a substantially single crystal is formed.

As shown in FIG. 9A, island-like silicon thin film regions 250 and 351 are formed in a photo-etching process carried out after annealing. Through an impurities diffusion process, a gate insulating film formation process, and so on, performed on predetermined regions, a gate electrode 253, a source electrode 254 and a drain electrode 255 are formed as shown in FIG. 9B. Thus, a thin film transistor (TFT) is completed. When the grain boundary direction of the belt-like crystal grain (the growth direction of the crystal) is made to coincide with the direction in which a current will flow as shown in FIG. 9B, there is no fear that the current cuts across the grain boundary. Thus, the silicon film may be regarded as substantially single crystalline. In this event, a value of 400 $cm^2/V$ or higher, typically a value of 450 $cm^2/V$ can be obtained as the mobility of the silicon film.

Figure 10A:
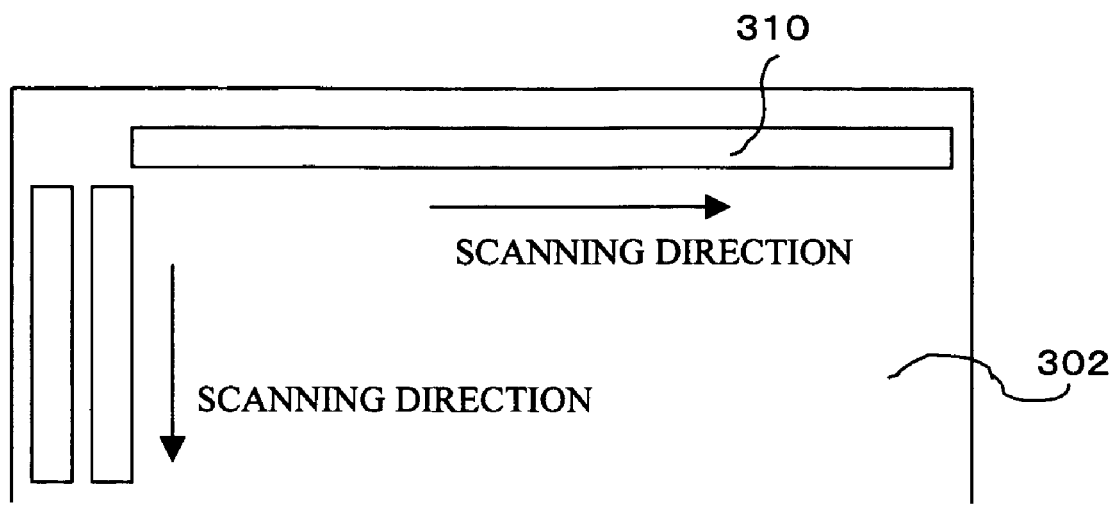
FIGS. 10A and 10B are views showing regions annealed according to another embodiment of the present invention.
Figure 10B:
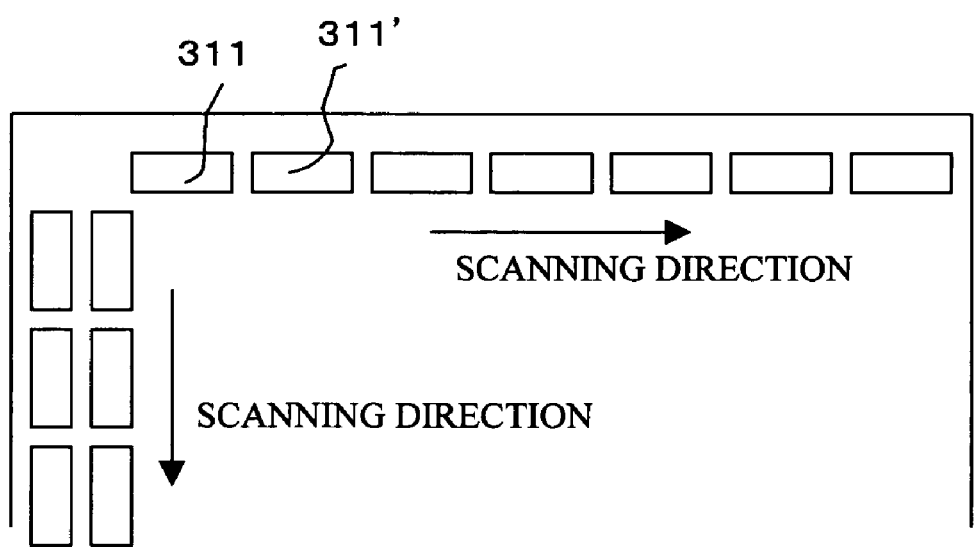

Although only a glass substrate corresponding to one panel is shown in FIGS. 7A-7C, in fact a large number of panels are formed in the substrate. FIGS. 10A and 10B are views showing regions annealed according to another embodiment of the present invention. As shown in FIG. 10A, irradiation with the laser beam 103 is performed to form one continuous block 310 in one panel 302. Alternatively, as shown in FIG. 10B, the laser beam 103 may be turned on/off repeatedly by an EO modulator so as to form a quasi-single crystalline region divided into a plurality of irradiated blocks 311, 311', . . . . However, at least in a gap portion between panels, the laser beam has to be turned off or made to have energy density low enough not to produce crystal growth, in order to update crystal growth.

Although laser irradiation of the drain (signal wire) driver circuit portion 104 is completed by one scan in FIG. 7A, the irradiation width (the longitudinal size of the beam shaped into a linear shape) depends on the output power of the laser 103 and the width required for forming a driver circuit on design. When all of a predetermined region can not be annealed by one scan, a plurality of scans maybe carried out in accordance with necessity.

Referring to FIGS. 7A-7C again, when the laser irradiation of the drain (signal wire) driver circuit portion 104 is terminated, the container 17 receiving the image rotator 13 in FIG. 1 is rotated at an angle of 45 degrees so that the image rotator 13 received inside the container 17 is rotated at an angle of 45 degrees around the optical axis of the laser beam. Alternatively, the beam shaper 10 is rotated at an angle of 90 degrees. After that, in accordance with design information, the XY stage 14 is moved in a direction (turning at an angle of 90 degrees) perpendicular to the direction in which the drain driver circuit portion 104 was annealed. Thus, as shown in FIG. 7B, a gate (scan wire) driver circuit portion 106 is scanned and irradiated with the laser beam 103 in the same manner as the drain (signal wire) driver circuit portion 104.

Although one panel is irradiated with the continuous laser beam 103 in FIG. 7B, the laser beam 103 may be turned on/off repeatedly by an EO modulator so as to form a quasi-single crystalline region divided into a plurality of blocks. In addition, although the laser irradiation of the gate (scan wire) driver circuit portion 106 is completed by one scan in FIG. 7B, the irradiation width depends on the output power of the laser 103 and the width required for forming a driver circuit on design. When all of a predetermined region cannot be annealed by one scan, a plurality of scans maybe carried out in accordance with necessity.

Next, if necessary, as shown in FIG. 7C, the stage is moved while a peripheral circuit portion 107 such as an interface circuit portion is irradiated with the laser beam 103 in the same manner as the drain (signal wire) driver circuit portion 104 and the gate (scan wire) driver circuit portion 106. Thus, the laser annealing process on the substrate 15 is completed. The substrate 15 subjected to the process is conveyed to the outside by a conveyance robot (not shown) or the like. Next, a new substrate is conveyed, and the annealing process is continued.

According to the aforementioned method, the drain driver circuit region 104, the gate driver circuit region 106 and, if necessary, the peripheral circuit region 107 of the polycrystalline film formed on the glass substrate 15 can be irradiated with a temporally modulated in amplitude continuous wave laser beam condensed into a long and narrow shape. Due to this irradiation, the silicon film is fused, and solidified again as soon as the laser beam has gone through the silicon film. Thus, crystal grains grow up in the scanning direction of the laser beam. Although each crystal grain formed at this time varies according to the laser irradiation condition, the crystal grain typically becomes a belt-like crystal 5-50 microns long in the scanning direction of the laser beam and about 0.2-2 microns long in a direction perpendicular to the scanning direction of the laser beam. When the source-drain direction of a TFT (Thin Film Transistor) to be formed on the glass substrate is aligned with the growth direction of the crystal, a high-performance transistor can be formed.

Although this embodiment has been described about the case where a substrate having a polycrystalline silicon film formed on a glass substrate is annealed, it is a matter of course that the same effect can be obtained when a substrate having an amorphous silicon film formed on a glass substrate is annealed.

In such a manner, the laser annealing method and the laser annealing apparatus according to the present invention can be applied to manufacturing of a display panel represented by a TFT or liquid crystal panel or an organic EL panel. When the present invention is applied to manufacturing of a liquid crystal panel, laser annealing as described in the aforementioned embodiment is applied to a substrate (TFT substrate) also called an active matrix substrate to serve as one of a pair of substrates. Thin film transistors of driver circuits, and so on, are built in a silicon film obtained thus. A display region includes a large number of pixels formed in a matrix. The other substrate of the two substrates is pasted onto the obtained substrate, and liquid crystals are charged into a gap between the two substrates. Thus, a liquid crystal panel is obtained. On the other hand, in the case of an organic EL panel, an organic emission layer is applied to each pixel belonging to a TFT substrate. An insulating member called a seal can for shutting the organic emission layer from ambient environment and preferably made of glass is pasted onto the TFT substrate.

The aforementioned embodiments have been described about the case where a laser oscillator for generating a continuous wave laser beam is used as a laser to be used for annealing a silicon thin film. However, the laser annealing method and the laser annealing apparatus according to the present invention are not limited to such a laser. It is obvious that the laser annealing method and the laser annealing apparatus according to the present invention can be applied to annealing by irradiation with a pulsed laser such as an excimer laser, a harmonic of an LD pumped pulsed YAG laser, a harmonic of an LD pumped $YVO_4$ laser, a harmonic of LD pumped YLF laser, or the like, on a substrate in which an amorphous silicon thin film or a polycrystalline silicon thin film is formed. Particularly, the present invention can be also applied to an annealing method also called SLS (Sequential Lateral Solidification), in which irradiation with a pulsed laser beam condensed linearly and at a very small pitch not longer than 1 micron (typically about 0.5 microns) and movement of the laser beam with high accuracy are repeated, or irradiation is performed constantly repeatedly while moving the laser beam at a constant speed, so as to grow crystals in the moving direction of the laser beam.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications a fall within the ambit of the appended claims.

We claim:

1. A laser annealing apparatus comprising:
   a stage for moving a substrate mounted thereon in two directions crossing each other at right angles;

a laser oscillator for oscillating a laser beam;

a beam shaper for shaping said laser beam into a long and narrow shape;

an imaging lens disposed in a positional relationship such that said laser beam shaped into said long and narrow shape is projected onto said substrate mounted on said stage; and a unit for rotating said laser beam shaped into said long and narrow shape around an optical axis of said laser beam;

wherein said beam shaper for shaping said laser beam into said long and narrow shape is one of a combination of a Powell's lens and a cylindrical lens, a kaleidoscope, and a diffractive optical element.

2. A laser annealing apparatus according to claim 1, further comprising:

a relay lens for converting said laser beam shaped into said long and narrow shape to a collimated beam wherein said imaging lens is disposed in said positional relationship such that said collimated laser beam is projected onto said substrate mounted on said stage in a state where said laser beam has been shaped into said long and narrow shape.

3. A laser annealing apparatus according to claim 1, wherein said unit for rotating said laser beam shaped into said long and narrow shape around said optical axis of said laser beam is an image rotator inserted after said beam shaper for shaping said laser beam into a linear shape or a rectangular shape and before said imaging lenses.

4. A laser annealing apparatus according to claim 2, wherein said unit for rotating said laser beam shaped into said long and narrow shape around said optical axis of said laser beam is an image rotator inserted after said beam shaper for shaping said laser beam into a linear shape or a rectangular shape and before said imaging lenses.

5. A laser annealing apparatus according to claim 3, wherein said beam shaper for shaping said laser beam into said long and narrow shape is one of the combination of the Powell's lens and the cylindrical lens, the kaleidoscope, the diffractive optical element, and a combination of a multi-lens array and a cylindrical lens.

6. A laser annealing apparatus according to claim 4, wherein said beam shaper for shaping said laser beam into said long and narrow shape is one of the combination of the Powell's lens and the cylindrical lens, the kaleidoscope, the diffractive optical element, and a combination of a multi-lens array and a cylindrical lens.

7. A laser annealing apparatus according to claim 1, wherein said unit for rotating said laser beam shaped into said long and narrow shape around said optical axis is a mechanism by which at least said beam shaper for shaping said laser beam into said long and narrow shape can be rotated desirably around said optical axis of said laser beam.

8. A laser annealing apparatus according to claim 2, wherein said unit for rotating said laser beam shaped into said long and narrow shape around said optical axis is a mechanism by which at least said beam shaper for shaping said laser beam into said long and narrow shape can be rotated desirably around said optical axis of said laser beam.

9. A laser annealing apparatus according to claim 1, wherein said laser oscillator is an oscillator for generating a continuous wave laser beam, and a temporal amplitude modulator is placed before said beam shaper for shaping said laser beam into said long and narrow shape so that said continuous wave laser beam temporally modulated in amplitude by said temporal amplitude modulator can be shaped into said long and narrow shape.

10. A laser annealing apparatus according to claim 1, wherein said substrate has an amorphous silicon film or a polycrystalline silicon film formed in one principal surface thereof, and said stage, said imaging lens and said unit for rotating said laser beam enables scanning of a desired region of said amorphous silicon film or said polycrystalline silicon film on said substrate while irradiating said desired region with said laser beam shaped into said long and narrow shape, and in order to scan said substrate with said laser beam in a plurality of directions, said laser beam shaped into said long and narrow shape is rotated around an optical axis of said laser beam within rotating said substrate, while said stage mounted with said substrate is moved only in two directions crossing each other at right angles, so that said desired region can be radiated at any position and in any direction with said laser beam shaped into said long and narrow shape.

* * * * *